(12) United States Patent
Hong

(10) Patent No.: US 6,461,913 B2
(45) Date of Patent: Oct. 8, 2002

(54) SEMICONDUCTOR MEMORY DEVICE HAVING PLUG CONTACTED TO A CAPACITOR ELECTRODE AND METHOD FOR FABRICATING A CAPACITOR OF THE SEMICONDUCTOR MEMORY DEVICE

(75) Inventor: Kwon Hong, Ichon (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 09/882,284

(22) Filed: Jun. 18, 2001

(65) Prior Publication Data

US 2002/0030217 A1 Mar. 14, 2002

(30) Foreign Application Priority Data

Jun. 19, 2000 (KR) ........................................ 2000-33617

(51) Int. Cl.⁷ ......................................... H01L 21/8242
(52) U.S. Cl. ...................... 438/253; 438/629; 438/653; 438/641
(58) Field of Search ................................. 438/253, 396, 438/629, 641, 653, FOR 212, 256

(56) References Cited

U.S. PATENT DOCUMENTS

| 5,392,189 | A | * | 2/1995 | Fazan et al. |
| 5,825,609 | A | * | 10/1998 | Andriacos et al. |
| 5,877,062 | A | | 3/1999 | Horii |
| 5,892,254 | A | | 4/1999 | Park et al. |
| 6,162,744 | A | * | 12/2000 | Al-Shareef et al. |
| 6,165,834 | A | * | 12/2000 | Agarwal et al. |
| 6,194,227 | B1 | * | 2/2001 | Hase |
| 6,194,752 | B1 | * | 2/2001 | Ogasahara et al. |
| 6,235,579 | B1 | * | 5/2001 | Lou |
| 6,235,603 | B1 | * | 5/2001 | Melnick et al. |
| 6,255,187 | B1 | * | 7/2001 | Horii |
| 6,291,250 | B1 | * | 9/2001 | Igarashi |
| 6,291,292 | B1 | * | 9/2001 | Yang |
| 6,326,315 | B1 | * | 12/2001 | Uchiyama et al. |
| 6,335,241 | B1 | * | 1/2002 | Hieda et al. |
| 6,348,420 | B1 | * | 2/2002 | Raaijmakers et al. |

FOREIGN PATENT DOCUMENTS

| EP | 0847083 A2 | 8/1997 | ....... H01L/24/3205 |
| EP | 0969506 A2 | 7/1999 | ....... H01L/21/8242 |

* cited by examiner

*Primary Examiner*—Wael Fahmy
*Assistant Examiner*—Joannie A. Garcia
(74) *Attorney, Agent, or Firm*—Jacobson Holman, PLLC

(57) ABSTRACT

The present invention provides a semiconductor memory device and a method of preventing the contact between a dielectric layer of a capacitor and a diffusion barrier. The plug to be contacted to an electrode of a capacitor, comprises a diffusion barrier layer and a conducting layer. The conducting layer is formed with a material capable of flowing current when the conducting layer is oxidized. Accordingly, it is possible to prevent the dielectric layer being contacted with the diffusion barrier, there by the leakage current may be reduced, and the capacitance of the capacitor may be increased.

7 Claims, 7 Drawing Sheets

SEMICONDUCTOR MEMORY DEVICE HAVING PLUG CONTACTED TO A CAPACITOR ELECTRODE AND METHOD FOR FABRICATING A CAPACITOR OF THE SEMICONDUCTOR MEMORY DEVICE

BACKGROUND OF THE INVENTION

1. Field of the Invention

The present invention relates to a method for fabricating a semiconductor memory device; and more particularly, to a method for fabricating a capacitor of a semiconductor memory device.

2. Description of the Prior Art

A DRAM (Dynamic Random Access Memory) cell is a semiconductor memory device typically comprising of one transistor and one capacitor, in which one bit of data is stored in a cell by using an electric charge. A capacitor comprises of a lower electrode, a dielectric layer, and an upper electrode. One electrode of the capacitor is connected to the source/drain junction of the transistor. Another electrode of the capacitor is connected to a reference voltage line.

Advances in computer applications have increased the demand for higher capacity memory chips. By decreasing the size of the memory cells, more memory cells can be packed into an integrated circuit.

The capacitance of a capacitor is proportional to the surface area of the electrodes and a dielectric constant of a dielectric layer. As the area of the memory cell has decreased, the capacitance of the capacitor tends to decrease. This lowers the performance of the memory cells.

In order to increase the density of the memory cells, stacked capacitors have been proposed. Stacked capacitors are formed by partially stacking the storage electrode over the transistor and over the bit/word line, thereby effectively reducing the area used for each memory cell.

A plug is used to connect the lower electrode of the capacitor with the source/drain junction of the transistor.

A method for fabricating a capacitor of a semiconductor memory device according to the conventional method is described by referring to FIG. 1A to FIG. 1C.

As shown in FIG. 1A, an insulating layer 15 is formed over a semiconductor substrate 10, an isolation layer 11, such as field oxide layer, and a transistor comprising a gate insulating layer 12, a gate electrode 13 and the source/drain junctions 14. Thereafter, a plug 16 is formed in the interlayer insulating layer. The plug 16 is composed of a polysilicon layer 16A, an ohmic contact layer 16B and a diffusion barrier layer 16C formed in a contact hole, exposing one of the source/drain junctions 14.

As shown in FIG. 1B, a lower electrode 17 is formed on the diffusion barrier layer 16C by depositing and patterning a first conductive layer. The diffusion barrier layer 16C may be exposed during the formation of the lower electrode 17 because of a mask misalignment. The mask misalignment frequently occurs in the manufacturing process of the highly integrated device.

As shown in FIG. 1C, a dielectric layer 18 is formed on the lower electrode 17 and an upper electrode 19 is formed on the dielectric layer 18. The dielectric layer 18 is formed with a material exhibiting a very high dielectric constant, such as Barium Strontium Titanate (BaSrTiO$_3$, hereafter abbreviated BST), to increase the capacitance in a highly integrated device.

According to the stated conventional method, the exposed part of the diffusion barrier layer 16C of the plug 16 is contacted to the dielectric layer 18.

There are several problems caused by the contact between the diffusion layer 16C and the dielectric layer 18. One problem is that the diffusion barrier layer 16C is oxidized during the process for forming the dielectric layer 18, because the dielectric layer 18, (such as the BST layer), is formed under an oxygen gas atmosphere and at a high temperature. The oxidized part of the diffusion barrier layer 16C, exhibiting low dielectric constant, plays the role of the dielectric layer of the capacitor, thereby the capacitance of the capacitor is reduced. The other problem is that the work function difference, between the diffusion barrier 16C and the dielectric layer 18, is low. Thus, the leakage current is increased, because of the low Schottky barrier height.

SUMMARY OF THE INVENTION

It is, therefore, an object of the present invention to provide a semiconductor memory device and a fabrication method capable of preventing the contact between a dielectric layer of a capacitor and a diffusion barrier of a plug.

It is, therefore, another object of the present invention to provide a semiconductor memory device and a fabrication method capable of preventing a lowering of the capacitance of the capacitor and an increase of the leakage current between the lower electrode of the capacitor and a diffusion barrier of a plug, In accordance with an aspect of the present invention, there is provided a semiconductor memory device, comprising a semiconductor substrate, wherein a gate electrode is formed on the semiconductor substrate, and wherein source/drain junctions are formed in the semiconductor substrate.

An interlayer insulating layer is formed over the semiconductor substrate and a plug is formed in the interlayer insulating layer. The plug comprises a diffusion barrier layer and a conducting layer, and wherein the conducting layer is formed with a material capable of current flowing when the conducting layer is oxidized.

A lower electrode of the capacitor is contacted to the conducting layer. A dielectric layer is formed on the lower electrode and an upper electrode is formed on the dielectric layer.

In accordance with another aspect of the present invention, there is provided a method for fabricating a semiconductor memory device, comprising the steps of providing a semiconductor substrate, wherein a gate electrode is formed on the semiconductor substrate, and wherein source/drain junctions are formed in the semiconductor substrate.

Another part of the method is to form an interlayer insulating layer over the semiconductor substrate and etching the interlayer insulating layer to form a contact hole. By forming a diffusion barrier layer and a conducting layer in the contact hole a plug is formed, wherein the conducting layer is formed with a material capable of current flowing when the conducting layer is oxidized. A lower electrode is formed and is contacted to the conducting layer. A dielectric layer is formed on the lower electrode and an upper electrode is formed on the dielectric layer.

In accordance with a still further aspect of the present invention, there is a method for fabricating a semiconductor memory device. The method includes the steps of providing a semiconductor substrate, wherein a gate electrode is formed on the semiconductor substrate, and wherein source/drain junctions are formed in the semiconductor substrate. Additionally, an interlayer insulating layer is formed over the semiconductor substrate and the interlayer insulating layer is etched to form a contact hole.

A plug is formed out of a diffusion barrier and a conducting layer in the contact hole, and wherein the conducting layer is formed with a material capable of current flowing when the conducting layer is oxidized. Additionally, a seed layer is formed on the conducting layer and a glue layer is formed on the seed layer. The method further includes a sacrificial layer formed on the glue layer. At this point, the sacrificial layer and the glue layer are etched to form an opening defining a region of a lower electrode.

The lower electrode is formed on the seed layer in the opening, and the sacrificial layer and the seed layer are removed to form a dielectric layer on the lower electrode and an upper electrode is formed on the dielectric layer.

BRIEF DESCRIPTION OF THE DRAWINGS

The above and other objects and features of the present invention will become apparent from the following description of the preferred embodiments given in conjunction with the accompanying drawings, in which.

DESCRIPTION OF THE INVENTION

Hereinafter, a semiconductor memory device fabrication method according to the present invention will be described in detail referring to the accompanying drawings.

Figure 1A:
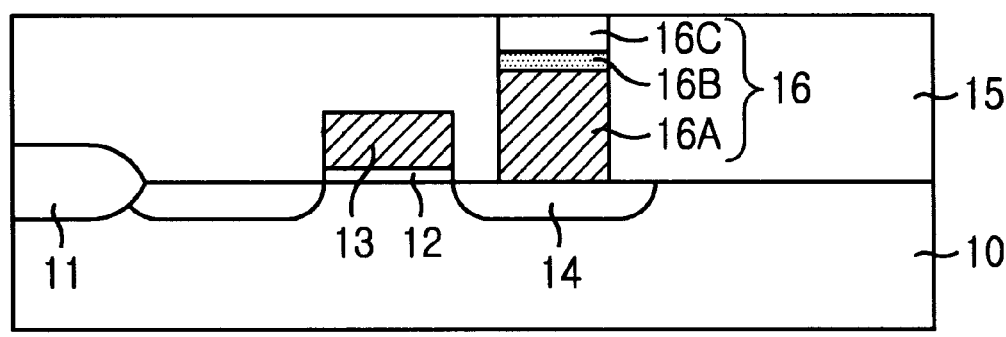
FIG. 1A to FIG. 1C are cross sectional views showing a method for fabricating a semiconductor memory device according to the conventional method.
Figure 1B:
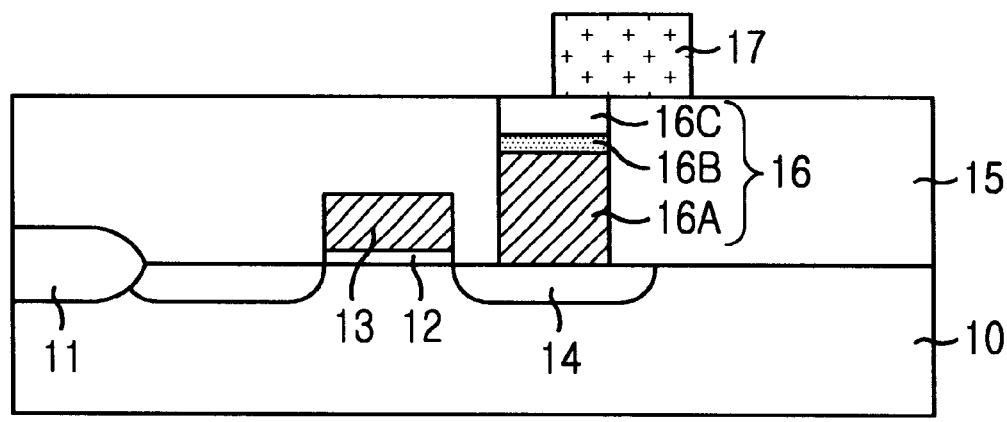
Figure 1C:
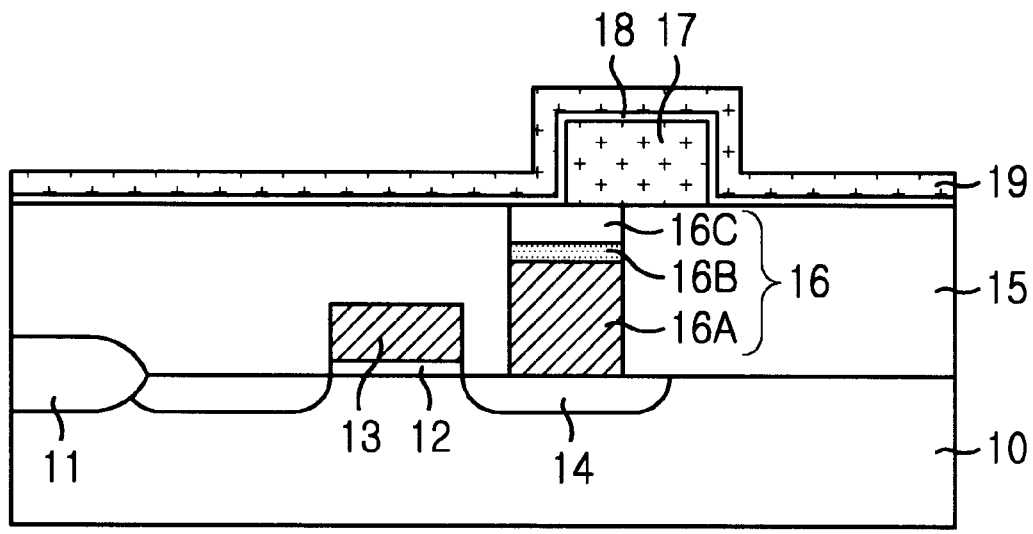
Figure 2A:
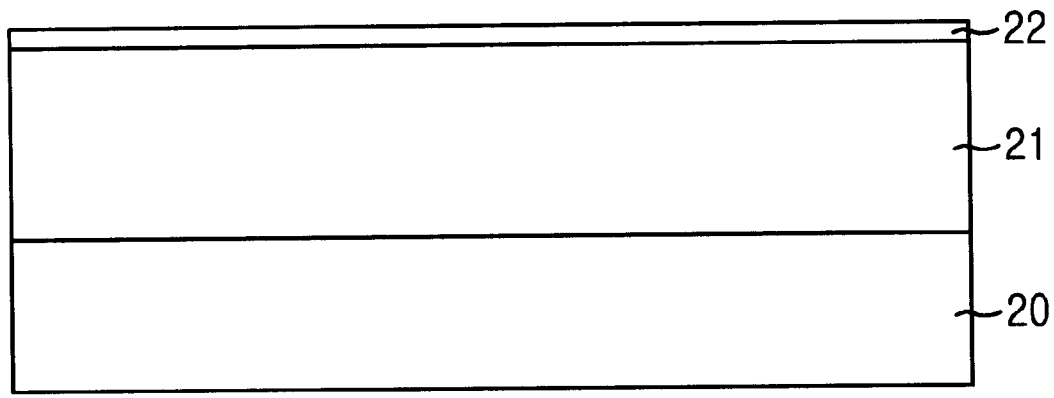
FIG. 2A to FIG. 2I are cross sectional views showing a method for fabricating a capacitor of a semiconductor device according to the present invention.

As shown in FIG. 2A, an interlayer insulating layer, composed of a first insulating layer 21 and a second insulting layer 22, is formed over a semiconductor substrate 20. A determined lower structure (not shown), comprises an isolation layer, such as a field oxide layer, and a transistor including a gate insulating layer, a gate electrode and the source/drain junctions. The second insulating layer 22 is formed with a material of which etching is selectivity higher than the first insulating layer 21. In a preferred embodiment of the present invention, the first insulating layer 21 is formed by depositing a silicon oxide layer to a thickness of 3000–8000 Å, and the second insulating layer 22 is formed by depositing a silicon nitride layer to a thickness of 300 to 1000 Å.

Figure 2B:
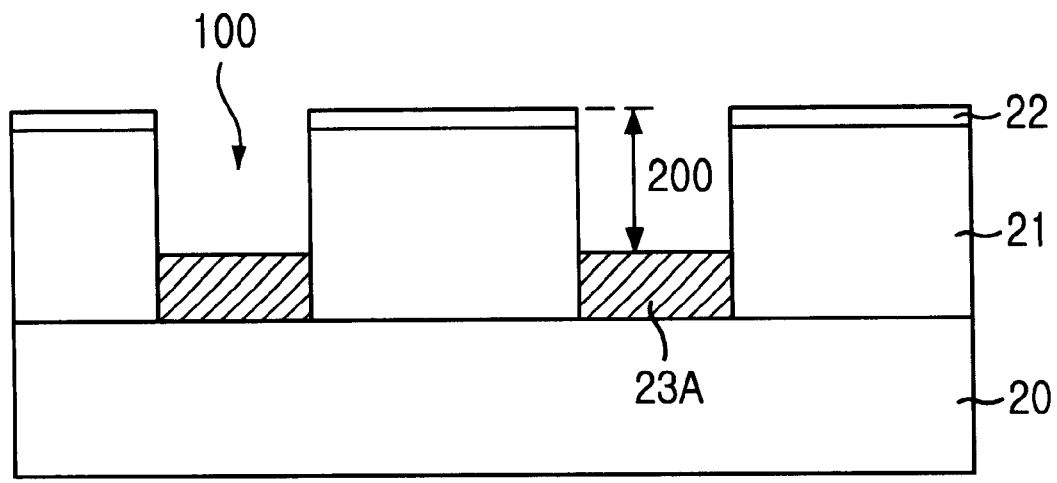

As shown in FIG. 2B, the second insulating layer 22 and the first insulating layer 21 are etched to form a contact hole 100. This etching exposes one of the source/drain junctions (not shown) formed in the semiconductor substrate 20. And then, a polysilicon layer 23A, for forming a plug, is deposited to a thickness of 500–3000 Å on the second insulating layer 22 and on the semiconductor substrate 20 in the contact hole. Thereafter, an etching process is performed to expose the surface of the second insulting layer 22 and to remove a part of the polysilicon layer 23A in the contact hole. Thereby, the height difference 200 between the surface of the second insulating layer 22 and the surface of the polysilicon layer 23A becomes 500 to 1500 Å.

Figure 2C:
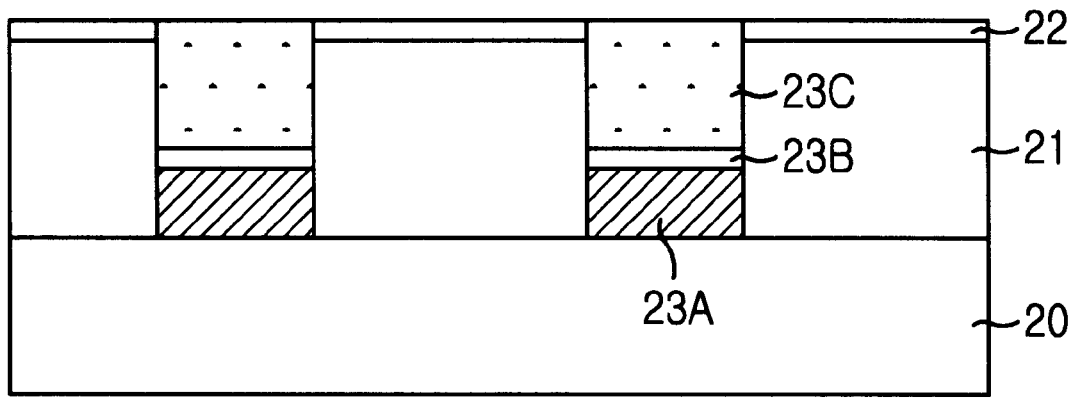

As shown in FIG. 2C, an ohmic contact layer 23B and a diffusion barrier layer 23C are formed, one by one, on the polysilicon layer 23A. Subsequently, a chemical mechanical polishing (hereafter, abbreviated CMP) process is performed until the surface of the second insulating layer 22 is exposed. In a preferred embodiment of the present invention, the ohmic contact layer 23B is formed with $TiSi_x$ and the diffusion barrier layer 23C is formed with TiN, TiSiN, TiAlN, TaSiN, TaAlN, $IrO_2$ or $RuO_2$. For forming the $TiSi_x$, a Ti layer is deposited. Next, an annealing process is performed for a reaction between Ti atom in the titanium layer and Si atom in the polysilicon layer 23A, and a wet etching process is performed to remove the Ti layer remaining on the second insulating layer 22 and the $TiSi_x$ layer.

Figure 2D:
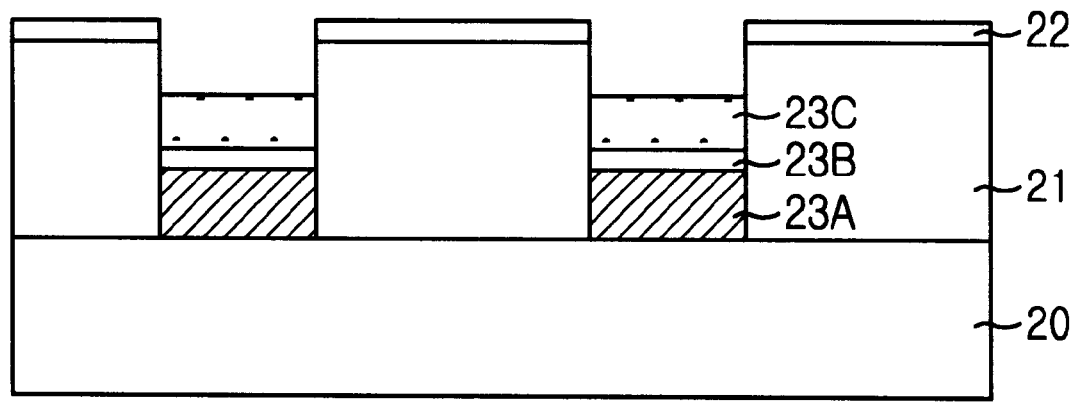

As shown in FIG. 2D, a part of the diffusion barrier layer 23C is etched using an etchant, such as a mixed gas comprising $Cl_2$ and $BCl_3$, to which the diffusion barrier layer 23C has a higher etching selectivity than the second insulting layer 22.

Figure 2E:
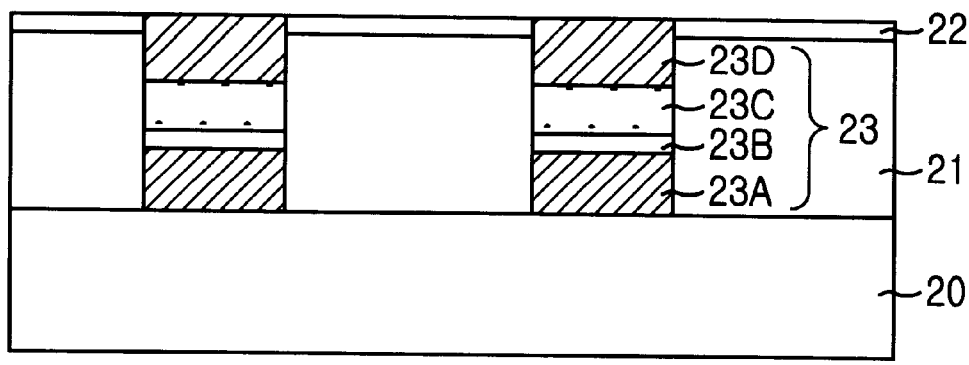

As shown in FIG. 2E, a conducting layer 23D is deposited on the second insulating layer 22 and the diffusion barrier layer 23C. A blanket etching process or a CMP process is performed until the second insulating layer 22 is exposed. Thereby, the plug 23, composed of polysilicon layer 23A, the ohmic contact layer 23B, the diffusion barrier 23C and the conducting layer 23D are completely formed. The conducting layer 23D is formed with a material which can flow current even if it is oxidized.

In the preferred embodiment of the present invention, Ru, Pt or Ir is deposited by using chemical vapor deposition technique, for forming the conducting layer 23D. On the other hand, the blanket etching process or the CMP process may be skipped, in order to use the conducting layer 23D as a seed layer for forming a lower electrode of a capacitor.

Also, the process for forming the polysilicon layer 23A may be omitted. In such a case, the plug 23 is composed of the ohmic contact layer 23B layer, the diffusion barrier layer 23C and the conducting layer 24D. Moreover, the process for forming the ohmic contact layer 23B can be omitted, in such a case, the plug 23 is composed of the polysilicon layer 23A, the diffusion barrier layer 23C and the conducting layer 24D. Accordingly, it is possible that the plug 23 is composed of the diffusion barrier layer 23C and the conducting layer 23D.

Figure 2F:
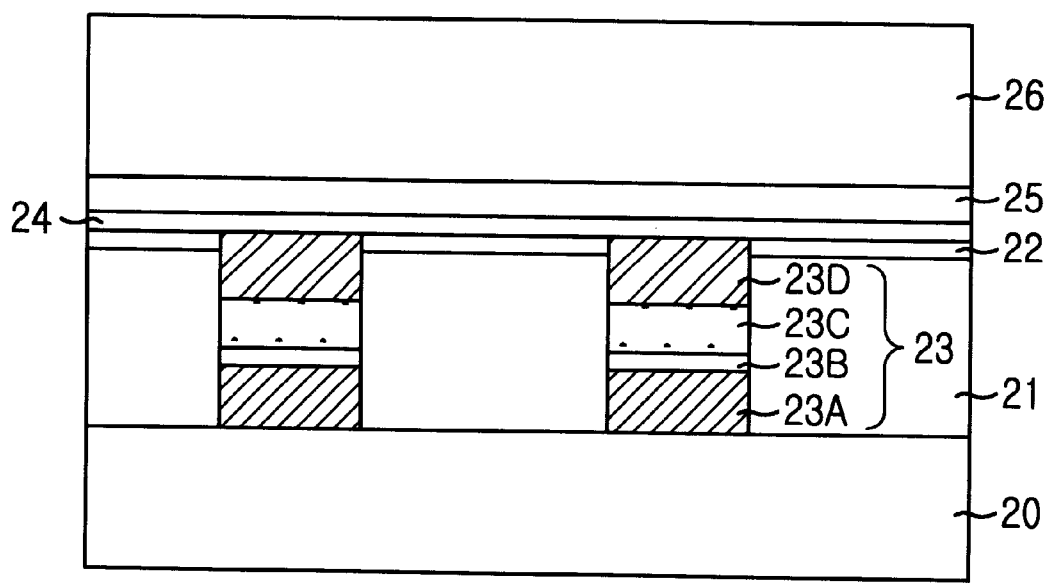

As shown in FIG. 2F, a seed layer 24 is formed on the conducting layer 23D and the second insulating layer 22. Thereafter, a glue layer 25 and a sacrificial layer 26 are stacked, one by one, on the seed layer 24. In the preferred embodiment of the present invention, the seed layer 24 is formed with Pt or Ru 50–100 Å A thick. The glue layer 25 is formed with TiN, TiAlN, TaN, TaSiN, $Al_2O_3$ or $TiO_2$ 50–500 Å thick, and the sacrificial layer 26 is formed with silicon oxide 5000–15000 Å thick. In cases when the conducting layer 23D is formed.

On the other hand, the processes for forming the seed layer 24 and the glue layer 25 can be omitted depending on the various methods for forming a lower electrode.

Figure 2G:
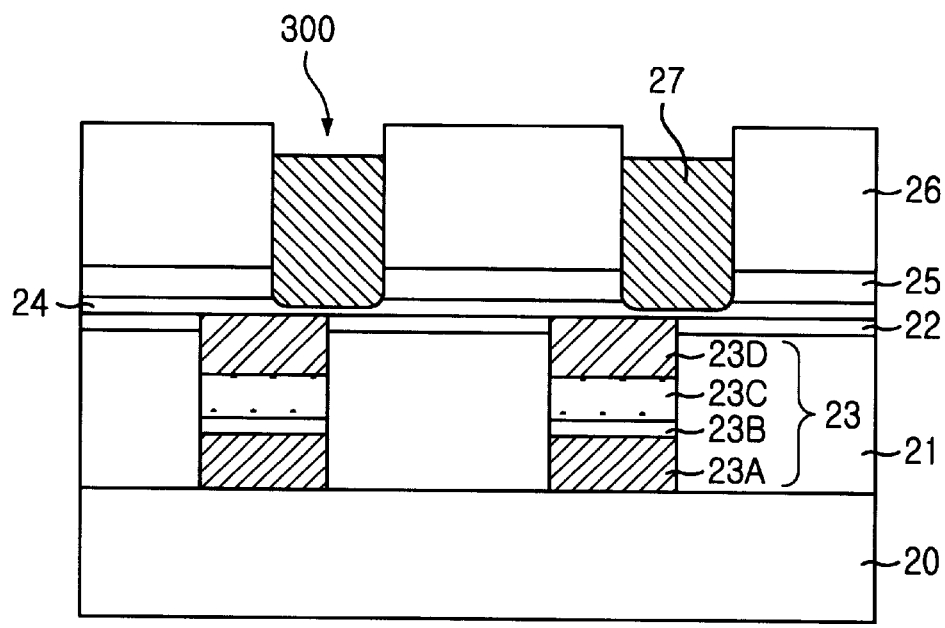

As shown in FIG. 2G, the sacrificial layer 26 and the glue layer 25 are selectively etched to form an opening 300. The opening 300 is for exposing the seed layer 24, and a lower electrode 27 is formed on the seed layer 24 in the opening 300. In the preferred embodiment of the present invention, a Pt layer, as the lower electrode 27, is deposited to a thickness of 4000–12000 Å by the electroplating. A current density of 0.1–20 $mA/cm^2$ is imposed on the electrodes for electroplating, with a DC or a DC pulse.

Figure 2H:
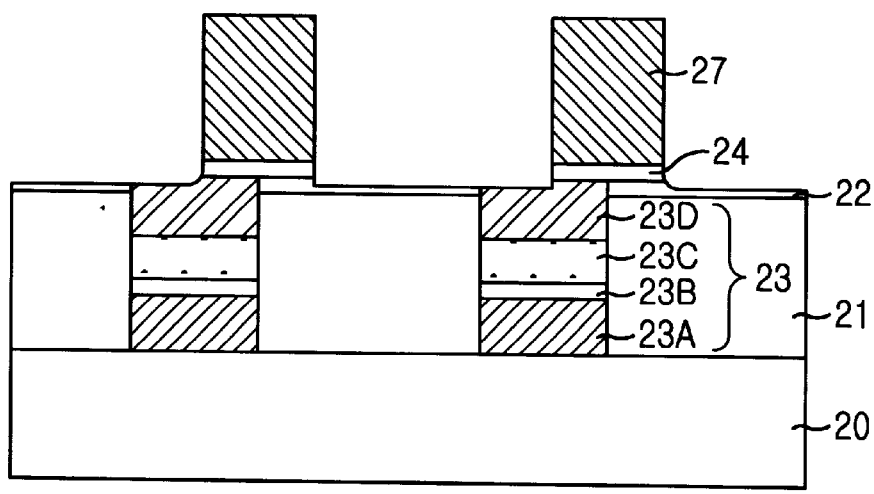

As shown in FIG. 2H, the sacrificial layer 26, the glue layer 25 and the seed layer 24 are removed to separate the neighboring lower electrodes 27. The sacrificial layer 26 and the glue layer 25 are removed by wet etching, and the seed layer 24 is removed by dry etching. Also, the glue layer 25 can be removed by dry etching.

According to the preceding process of the present invention, the diffusion barrier layer 23C of the plug 23 is not exposed, even if the mask misalignment has occurred in the process for forming the opening 300. That is, the conducting layer 23D, covering the diffusion layer 23C, is exposed in the case of the occurring mask misalignment.

Figure 2I:
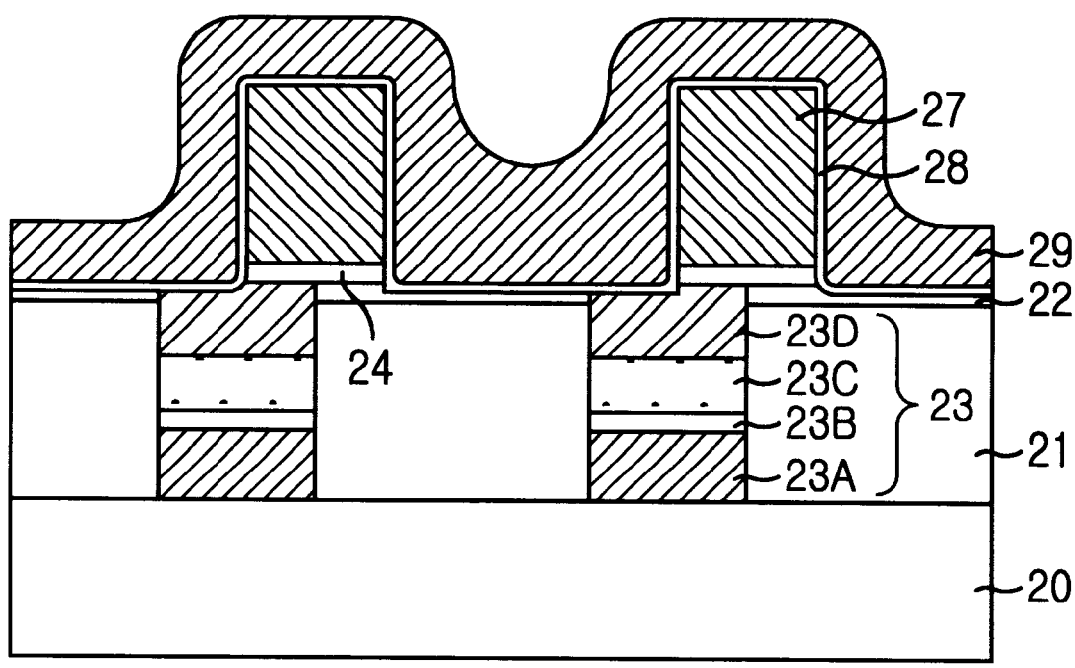

As shown in FIG. 2I, a dielectric layer 28 is deposited on the lower electrode 27 and the second insulating layer 22. Thereafter, an upper electrode 29 is formed on the dielectric layer 28. In the preferred embodiment of the present invention, a BST layer is deposited to a thickness of 150–500 Å at a temperature of 350–600° C. for forming the dielectric layer 28. Next, an annealing process, for crystallizing the dielectric layer 28, is performed in an N2 gas atmosphere at a temperature of 500–700° C. for 30–180 seconds, thereby the dielectric characteristic of the dielectric layer 28 may be improved. The upper electrode 29 is formed with a material, which current can flow even if it is oxidized, such as Pt, Ru, Ir.

There are several advantages to forming the conducting layer on the diffusion barrier. A first advantage is that it is possible to prevent the dielectric layer from being contacted with the diffusion barrier. A second advantage is that it is possible to reduce the leakage current. A third advantage is that it is possible to prevent the diffusion barrier from being exposed even if mask misalignment has occurred, thereby the annealing for crystallizing the dielectric layer can be performed at a high temperature. A fourth advantage is that it is possible to obtain high capacitance of the capacitor in the highly integrated semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating semiconductor memory device, comprising the steps of:

providing a semiconductor substrate, forming a gate electrode on the semiconductor substrate, and forming a plurality of source/drain junctions in the semiconductor substrate;

forming an interlayer insulating layer over the semiconductor substrate;

etching the interlayer insulating layer to form a contact hole;

forming a plug with a diffusion barrier and a conducting layer in the contact hole, and forming the conducting layer with a material capable of flowing current when the conducting layer is oxidized;

forming a seed layer on the conducting layer;

forming a glue layer on the seed layer;

forming a sacrificial layer on the glue layer;

etching the sacrificial layer and the glue layer to form an opening defining a region of the lower electrode;

forming a lower electrode on the seed layer in the opening;

removing the sacrificial layer and the seed layer;

forming a dielectric layer on the lower electrode; and forming an upper electrode on the dielectric layer.

2. The method as recited in claim 1, the step of forming the plug including:

forming the diffusion barrier layer in the contact hole;

etching the diffusion barrier to remove a part of the diffusion barrier layer in the contact hole; and forming the conducting layer on the diffusion barrier layer.

3. The method as recited in claim 1, wherein the lower electrode is formed by an electroplating process.

4. The method as recited in claim 1, wherein the conducting layer is formed with Ir, Pt or Ir, and wherein the diffusion barrier layer is formed with TiN, TiSiN, TiAlN, TaSiN, TaAlN, $IrO_2$ or $RuO_2$.

5. The method as recited in claim 4, wherein a silicon oxide layer and a nitride layer are staked to form the interlayer insulating layer.

6. The method as recited in claim 5, wherein the diffusion barrier layer is etched with a mixed gas comprising $Cl_2$ and $BCl_3$.

7. The method as recited in claim 5, the dielectric layer is formed with a $BaSrTiO_3$ layer, and wherein the upper electrode is formed with Pt layer, Ru layer or Ir layer.

* * * * *